(12) United States Patent
Kwak et al.

(10) Patent No.: US 8,064,283 B2
(45) Date of Patent: Nov. 22, 2011

(54) SEMICONDUCTOR MEMORY APPARATUS AND A METHOD FOR READING DATA STORED THEREIN

(75) Inventors: Seung Wook Kwak, Ichon-si (KR); Kwan Weon Kim, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 128 days.

(21) Appl. No.: 12/470,836

(22) Filed: May 22, 2009

(65) Prior Publication Data
US 2010/0157696 A1 Jun. 24, 2010

(30) Foreign Application Priority Data
Dec. 24, 2008 (KR) .................. 10-2008-0133351

(51) Int. Cl.
*G11C 8/00* (2006.01)
(52) U.S. Cl. .............................. 365/230.03; 365/189.05
(58) Field of Classification Search ............. 365/230.03, 365/189.05
See application file for complete search history.

(56) References Cited

U.S. PATENT DOCUMENTS

| 7,280,412 | B2 * | 10/2007 | Jang et al. ............... 365/189.07 |
| 2007/0103996 | A1 * | 5/2007 | Park .............................. 365/191 |
| 2007/0247989 | A1 | 10/2007 | Hein |
| 2008/0019451 | A1 | 1/2008 | Jang et al. |

FOREIGN PATENT DOCUMENTS

| JP | 04-219851 | 8/1992 |
| JP | 11-053885 | 2/1999 |
| KR | 1020050058914 | 6/2005 |
| KR | 1020070045644 | 5/2007 |

* cited by examiner

*Primary Examiner* — Huan Hoang
(74) *Attorney, Agent, or Firm* — IP & T Group LLP (57) ABSTRACT

A semiconductor memory apparatus includes a data bus inversion (DBI) section configured to receive a plurality of input data and decide whether to invert or output, without an inversion, the plurality of input data depending upon logic levels of the plurality of data, and further configured to generate a plurality of inversion data based on the decision; and a data output section configured to receive the plurality of inversion data, invert or output, without an inversion the plurality of inversion data in response to a mode signal, and generate a plurality of output data.

26 Claims, 5 Drawing Sheets

SEMICONDUCTOR MEMORY APPARATUS AND A METHOD FOR READING DATA STORED THEREIN

CROSS-REFERENCES TO RELATED APPLICATION

The present application claims priority under 35 U.S.C. §119(a) to Korean application number 10-2008-0133351, filed on Dec. 24, 2008, in the Korean Intellectual Property Office, which is incorporated herein by reference in its entirety as set forth in full.

BACKGROUND

1. Technical Field

The present invention relates to a semiconductor memory apparatus, and, more particularly, to a semiconductor memory apparatus which adopts a data bus inversion scheme and a method for reading data stored in a semiconductor memory apparatus.

2. Related Art

As the data processing speeds of a central processing unit (CPU) and a graphic processing unit (GPU) gradually increase, semiconductor memory apparatuses operating at high frequencies are necessarily demanded in the art. However, in the case of semiconductor memory apparatuses operating at a high frequency band, the performance of the semiconductor memory apparatuses may be degraded due to the noise of data. In order to cope with this problem, a method has been proposed, in which data driver strength is increased or a semiconductor memory apparatus is designed in consideration of a clock margin. Nevertheless, the problems caused due to the fact that noise is generated and misoperation occurs due to the increase in the number of data switching times at a high frequency band, have not been solved yet.

Under this situation, a data bus inversion (DBI) scheme capable of minimizing the number of data switching times has been adopted. In the DBI scheme, a decision is made for how many data among data having a preset number of bits, for example, 8-bit data, cause current flow through a transistor constituting a data output buffer. As a result of the decision, if the data having logic values for causing current flow constitutes a majority, the logic values of the data are inverted so that current consumption can be reduced. For instance, when the data output buffer comprises a PMOS transistor, if the number of data having a low logic level among 8-bit data is less is than 5, the data are applied to the data output buffer without being inverted in the logic levels thereof. If the number of data having a low logic level is 5 or greater, the data are applied to the data output buffer by being inverted in the logic levels thereof.

Figure 1:
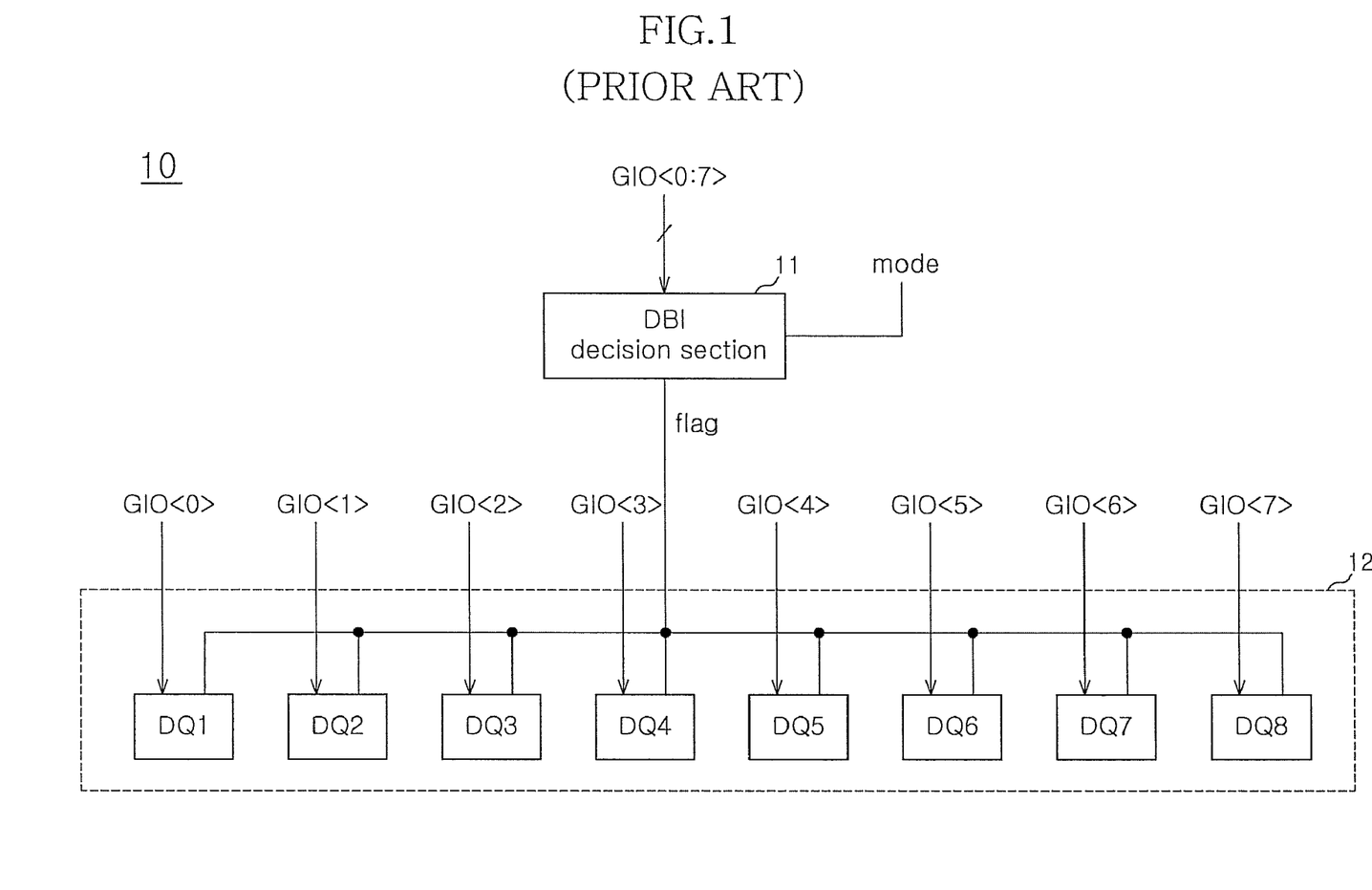
FIG. 1 is a schematic diagram illustrating the configuration of a conventional semiconductor memory apparatus.

FIG. 1 is a block diagram illustrating the schematic configuration of a conventional semiconductor memory apparatus. The conventional semiconductor memory apparatus 10 includes a DBI decision section 11 and a data output section 12. The DBI decision section 11 is enabled by receiving an enabled mode signal 'mode' from a mode register set. The DBI decision section 11 receives data 'GIO<0:7>' transmitted from a data input and output line, and generates a decision signal 'flag' for deciding whether to invert the data, depending upon the logic levels of the data 'GIO<0:7>'. The data output section 12 has a plurality of data output drivers DQ1 through DQ8. The data output section 12 receives the data 'GIO<0:7>' transmitted from the data input and output line and the decision signal 'flag' and decides whether to output the data by inverting the data or without inverting the data. If the mode signal 'mode' is enabled, the decision signal 'flag' is transmitted to a chipset which is connected with the semiconductor memory apparatus 10. Therefore, even though inverted data is outputted, the chipset can sense that the data having the logic levels opposite to those of the inverted output data are correct output data.

However, in the conventional semiconductor memory apparatus 10, because the decision as to whether to invert data is not made until operations of the data output section 12 occur, and then the data is inverted depending upon the result of the decision, a problem occurs in that current consumption may increase due to toggling of data input and output lines for transmitting the data. Also, in the conventional art, there is a problem that, due to the difficulties in interfacing among the semiconductor memory apparatus and the chipset, only when the mode signal 'mode' inputted from the mode register set indicates a DBI mode, the data inversion may be performed. When the mode signal 'mode' indicates a normal mode, the data inversion may not be performed.

SUMMARY

A semiconductor memory apparatus which may solve the difficulties in interfacing among chips so that data inversion can be performed not only in a DBI mode but also in a normal mode and may reduce current consumption due to toggling of data input and output lines and a method for reading data in a semiconductor memory apparatus, are described hereinafter.

In one aspect, a semiconductor memory apparatus includes a data bus inversion (DBI) section configured to receive a plurality of input data, decide whether to invert or output without an inversion the plurality of data depending upon logic levels of the plurality of data, and generate a plurality of inversion data based on the decision; and a data output section configured to receive the plurality of inversion data, invert or output, without an inversion, the plurality of inversion data in response to a mode signal, and generate a plurality of output data.

In another aspect, a semiconductor memory apparatus includes a plurality of memory banks; a first data input and output line configured to transmit a plurality of data inputted from the plurality of memory banks; a DBI section configured to decide whether to invert or output, without an inversion, the plurality of input data depending upon logic levels of the plurality of input data transmitted from the first data input and output line and generate a plurality of inversion data based on the decision; a second data input and output line configured to transmit the plurality of inversion data; and a data output section configured to receive the plurality of inversion data transmitted from the second data input to output line and generate a plurality of output data.

In still another aspect, a method for reading data in a semiconductor memory apparatus having a plurality of memory banks and operating in first and second modes includes deciding whether to invert or output, without an inversion, a plurality of data outputted from the plurality of memory banks depending upon logic levels of the plurality of data to generate a plurality of inversion data based on the decision; transmitting the plurality of inversion data through a data input and output line; and receiving the plurality of inversion data and generating a plurality of output data depending upon whether the semiconductor memory apparatus operates in the first mode or the second mode.

BRIEF DESCRIPTION OF THE DRAWINGS

The above objects, and other features and advantages will become more apparent after a reading of the following detailed description taken in conjunction with the drawings, in which.

DETAILED DESCRIPTION

Figure 2:
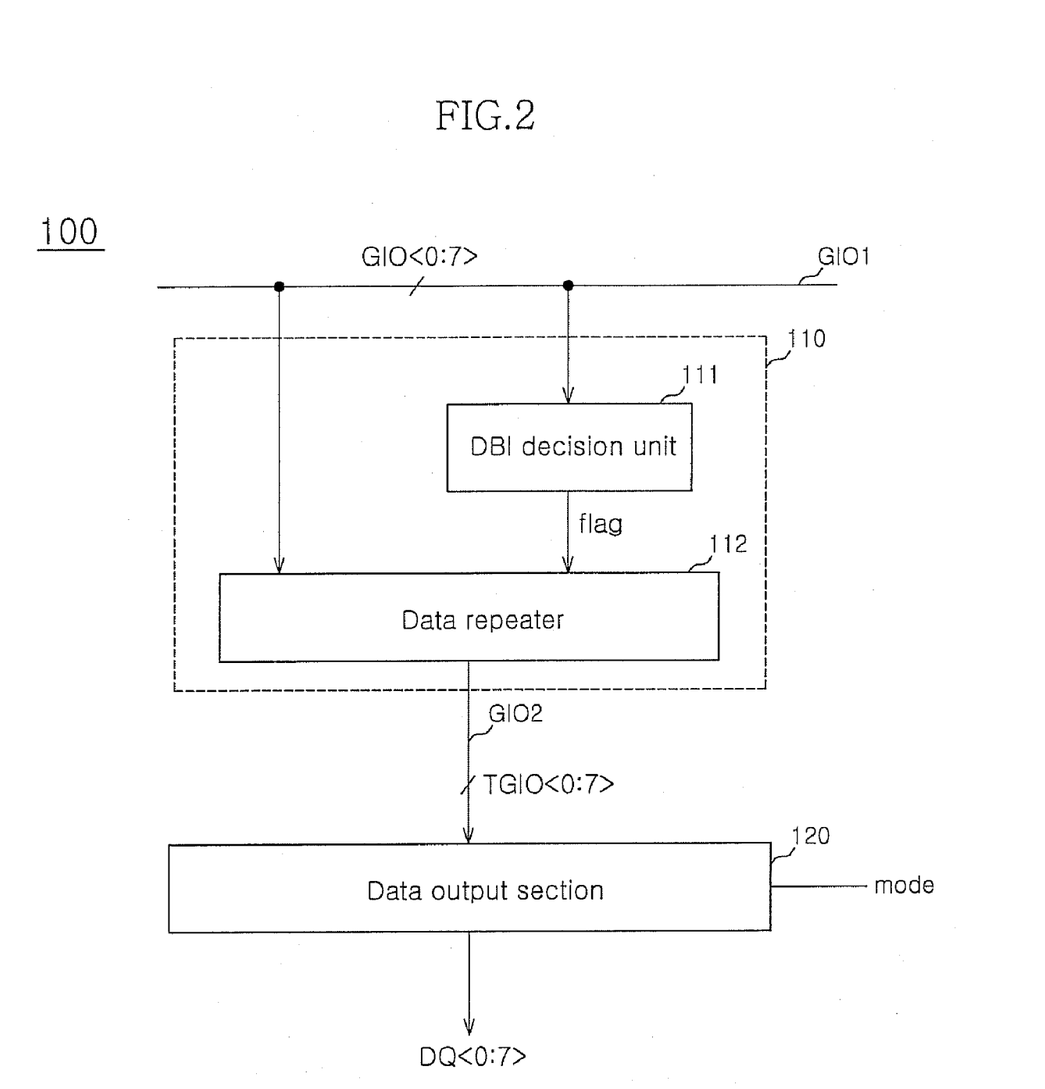
FIG. 2 is a schematic diagram illustrating the configuration of an exemplary semiconductor memory apparatus in accordance with a first embodiment of the present invention.

FIG. 2 is a schematic diagram illustrating the configuration of an exemplary semiconductor memory apparatus in accordance with a first embodiment of the present invention. Referring to FIG. 2, a semiconductor memory apparatus 100 in accordance with a first embodiment can include a data bus inversion (DBI) section 110 and a data output section 120.

The DBI section 110 can be configured to receive a plurality of data 'GIO<0:7>', decide whether to invert the plurality of data 'GIO<0:7>' depending upon the logic levels of the plurality of data 'GIO<0:7>', to generate a plurality of inversion data 'TGIO<0:7>'. In FIG. 2, the DBI section 110 can include a DBI decision unit 111 and a data repeater 112. The DBI decision unit 111 can be configured to receive the plurality of data 'GIO<0:7>' from a data input and output line GIO1 and decide whether to invert or not invert the plurality of data 'GIO<0:7>'. The DBI decision unit 111 can generate a decision signal 'flag' for deciding whether to invert the plurality of data 'GIO<0:7>' depending upon the logic levels of the plurality of data 'GIO<0:7>'. When the majority of the plurality of data 'GIO<0:7>' has a first logic level, the decision signal 'flag' can be generated in such a way as to invert the plurality of data 'GIO<0:7>', and when the majority of the plurality of data 'GIO<0:7>' has a second logic level, the decision signal 'flag' can be generated in such a way as not to invert the plurality of data 'GIO<0:7>'. In the first embodiment, the first logic level can be a logic low level, and the second logic level can be a logic high level. The DBI decision unit 111 can be configured in a manner such that it enables the decision signal 'flag' when the majority of the plurality of data 'GIO<0:7>' has the first logic level and disables the decision signal 'flag' when the majority of the plurality of data 'GIO<0:7>' has the second logic level. Preferably, the decision signal 'flag' is also transmitted to a chipset coupled to the semiconductor memory apparatus 100, depending upon an operation mode. For example, the decision signal 'flag' can be transmitted to the chipset in a first mode and cannot be transmitted to the chipset in a second mode. In the first embodiment, the first mode can be a DBI mode in which data inversion is performed, and the second mode can be a normal mode in which data inversion is not performed. As a signal for indicating that the semiconductor memory apparatus 100 operates in the first mode or the second mode, a mode signal 'mode' can be used. The mode signal 'mode' is a signal that can be generated through a mode register set of the semiconductor memory apparatus 100. Also, a test mode signal can be employed as the mode signal 'mode'. The semiconductor memory apparatus 100 according to the first embodiment can further include a transmission section (not shown) capable of deciding whether or not to transmit the decision signal 'flag' to the chipset. That is, if the semiconductor memory apparatus 100 includes the transmission section controlled by the mode signal 'mode', the decision signal 'flag' can be transmitted to the chipset when the mode signal 'mode' is enabled and cannot be transmitted to the chipset when the mode signal 'mode' is disabled.

The DBI decision unit 111 of the semiconductor memory apparatus 100 according to the first embodiment can be distinguished from the conventional art as described hereinafter. The DBI decision section 11 of the conventional art is decided to be enabled or not, by the mode signal 'mode'. That is, if the mode signal 'mode' is enabled, the DBI decision section 11 of the conventional art is activated to decide whether to invert data, and if the mode signal 'mode' is disabled, the DBI decision section 11 of the conventional art does not decide whether to invert data. However, the DBI decision unit 111 of the semiconductor memory apparatus 100 according to the first embodiment decides whether to invert data, depending upon the logic values of the plurality of data 'GIO<0:7>' irrespective of the first mode and the second mode. In other words, the DBI decision unit 111 of the semiconductor memory apparatus 100 according to the first embodiment decides whether to invert data, irrespective of the DBI mode and the normal mode. Accordingly, it is possible to minimize current consumption due to the toggling of a data input and output line through which inversion data 'TGIO<0:7>' generated by inverting or outputting, without an inversion, the plurality of data 'GIO<0:7>' are transmitted.

The data repeater 112 inverts or outputs, without an inversion, the plurality of data 'GIO<0:7>' which are inputted through the data input and output line GIO1, in conformity with the decision made by the DBI decision unit 111, and generates the plurality of inversion data 'TGIO<0:7>'. The data repeater 112 inverts or outputs, without an inversion, the plurality of data 'GIO<0:7>' in response to the decision signal 'flag' which is generated in the DBI decision unit 111. If the decision signal 'flag' is enabled, the data repeater 112 generates the plurality of inversion data 'TGIO<0:7>' by inverting the plurality of data 'GIO<0:7>'. If the decision signal 'flag' is disabled, the data repeater 112 generates the plurality of inversion data 'TGIO<0:7>' by outputting, without inversion, the plurality of data 'GIO<0:7>'. Hence, the DBI section 110 according to the first embodiment can consider the logic levels of the plurality of data 'GIO<0:7>' which are transmitted through the data input and output line GIO1, and can decide whether to invert or output, without an inversion, the plurality of data 'GIO<0:7>', depending upon the logic levels of the plurality of data 'GIO<0:7>'.

The data output section 120 is inputted with the plurality of inversion data 'TGIO<0:7>', inverts or outputs, without an inversion, the plurality of inversion data 'TGIO<0:7>' in response to a mode signal 'mode', and generates output data 'DQ<0:7>'. If the mode signal 'mode' is enabled, the data output section 120 generates the output data 'DQ<0:7>' by outputting, without an inversion, the plurality of inversion data 'TGIO<0:7>'. If the mode signal 'mode' is disabled, the data output section 120 generates the output data 'DQ<0:7>' by inverting the plurality of inversion data 'TGIO<0:7>'.

Figure 3:
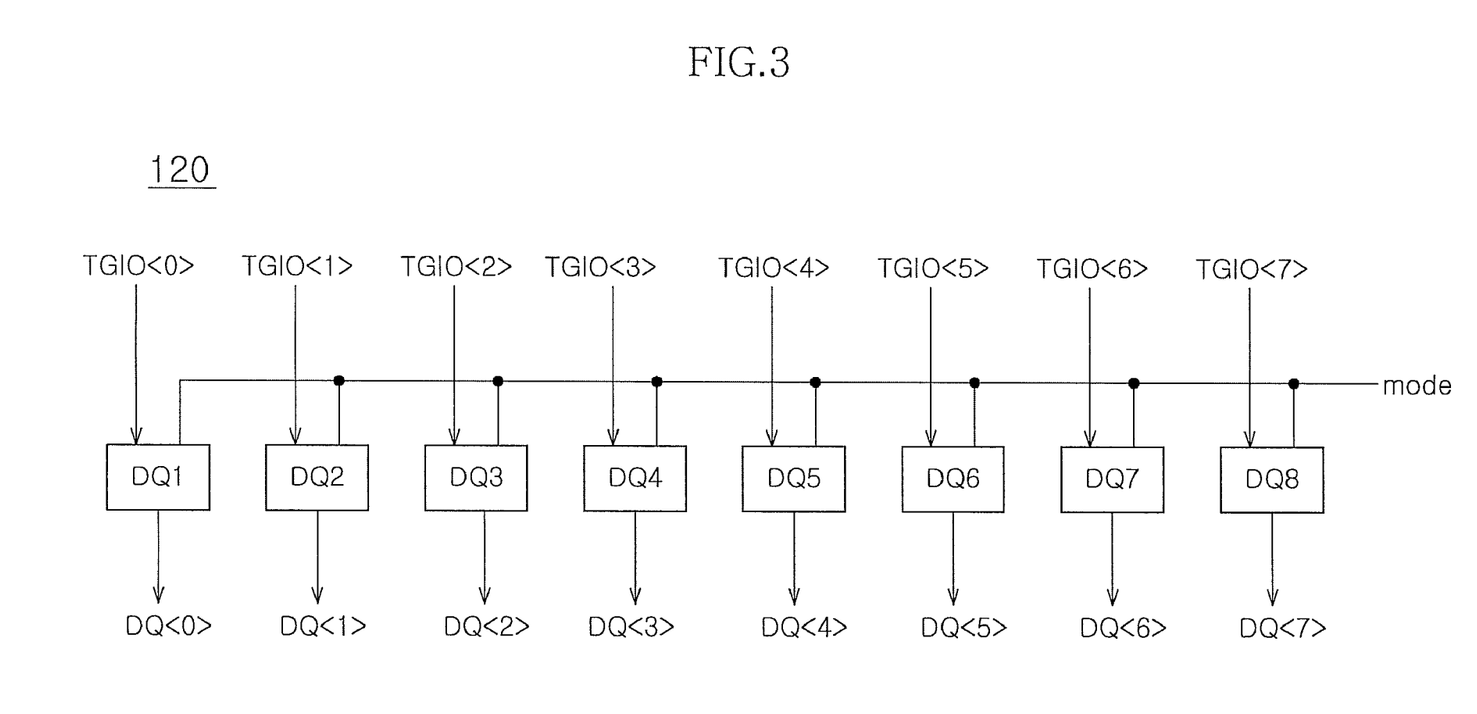
FIG. 3 is a schematic diagram illustrating the configuration of a data output section capable of being implemented in a semiconductor memory apparatus in accordance with the first embodiment.

FIG. 3 is a schematic diagram illustrating the configuration of a data output section capable of being implemented in the semiconductor memory apparatus of FIG. 1 in accordance with the first embodiment. In FIG. 3, the data output section 120 can be configured to be inputted with 8-bit data and output 8-bit data. Respective data output drivers DQ1 through DQ8, which constitute the data output section 120, are inputted with the corresponding inversion data 'TGIO<0>' through 'TGIO<7>' and generate the corresponding output data 'DQ<0>' through 'DQ<7>'. In detail, the respective data output drivers DQ1 through DQ8 are inputted with the corresponding inversion data 'TGIO<0>' through 'TGIO<7>' and generate the corresponding output data 'DQ<0>' through 'DQ<7>' by inverting or outputting, without an inversion, the inversion data 'TGIO<0>' through 'TGIO<7>' depending upon whether the mode signal 'mode' is disabled or enabled.

Figure 4:
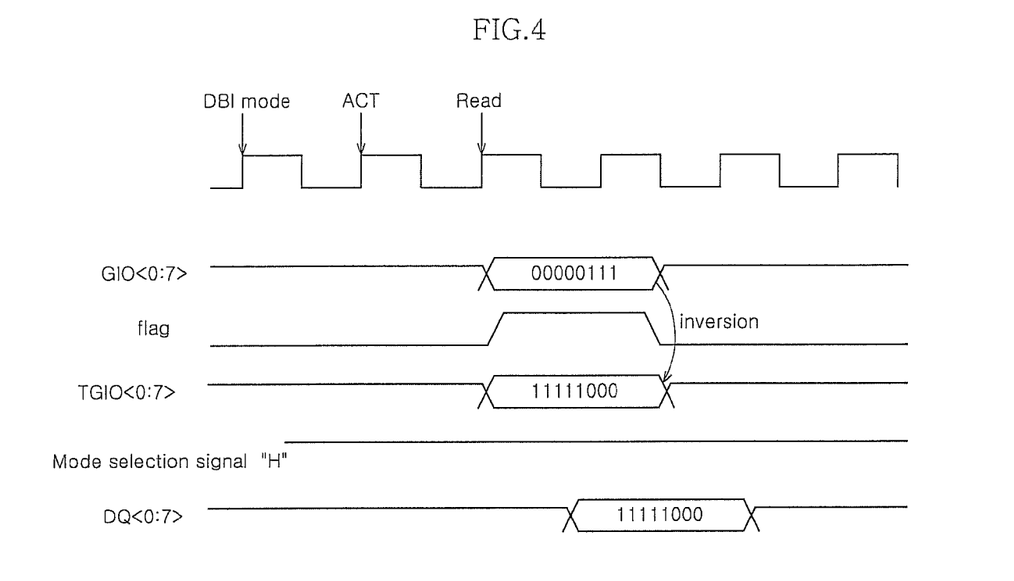
FIGS. 4 and 5 are timing diagrams illustrating the operation of the semiconductor memory apparatus in accordance with the first embodiment.
Figure 5:
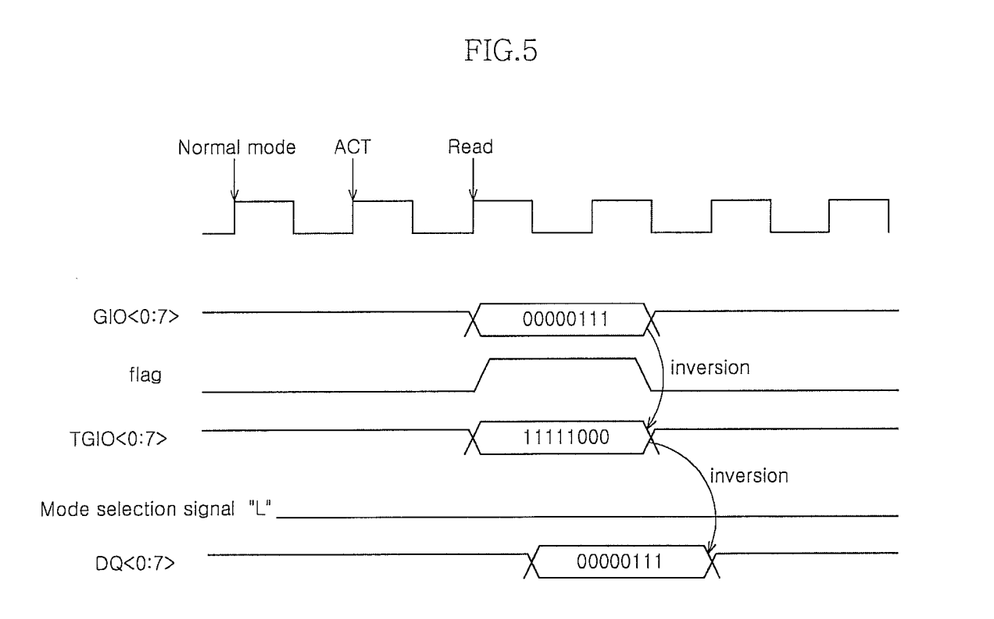

FIGS. 4 and 5 are timing diagrams illustrating the operation of the semiconductor memory apparatus 100 in accordance with the first embodiment. FIG. 4 is a timing diagram illustrating the operation of the semiconductor memory apparatus 100 according to the first embodiment in the first mode, that is, the DBI mode, and FIG. 5 is a timing diagram illustrating the operation of the semiconductor memory apparatus 100 according to the first embodiment in the second mode, that is, the normal mode. The operation of the semiconductor memory apparatus 100 according to the first embodiment will be described below with reference to FIGS. 2 through 5. After the mode signal 'mode' is enabled through the mode register set or by employing the test mode signal and the semiconductor memory apparatus 100 is set to operate in the first mode, if the semiconductor memory apparatus 100 is activated by being inputted with an active command 'ACT' and performs read operation in response to a read command 'Read', the data stored in the memory cells of a memory bank of the semiconductor memory apparatus 100 are loaded on the data input and output line GIO1. The plurality of data 'GIO<0:7>' loaded on the data input and output line GIO1 are inputted to the DBI decision unit 111 and the data repeater 112. The DBI decision unit 111 decides whether to enable or disable the decision signal 'flag', depending upon the logic levels of the plurality of data 'GIO<0:7>' inputted thereto.

In FIG. 4, since the majority of the plurality of data 'GIO<0:7>' has the low level, the DBI decision unit 111 enables the decision signal 'flag'. The data repeater 112 is inputted with the enabled decision signal 'flag', inverts the plurality of data 'GIO<0:7>', and outputs '1, 1, 1, 1, 1, 0, 0, 0' as the plurality of inversion data 'TGIO<0:7>'. Among the plurality of data 'GIO<0:7>', if the number of the data having the low level is greater than the number of the data having the high level, current consumption increases due to the toggling of data input and output lines GIO1 and GIO2. In this regard, in the first embodiment, when the data having the low level constitute a majority in the plurality of data 'GIO<0:7>', the plurality of data 'GIO<0:7>' are inverted and then inputted to the data output section 120, so that current consumption due to the toggling of the data input and output line GIO2, through which the plurality of inversion data 'TGIO<0:7>' are transmitted, can decrease.

Since the mode signal 'mode' is enabled in the first mode, the data output section 120 generates the plurality of output data 'DQ<0:7>' by outputting, without an inversion, the plurality of inversion data 'TGIO<0:7>'. Further, in the first mode, the decision signal 'flag' is inputted to the data repeater 112 and at the same time is transmitted to the chipset connected with the semiconductor memory apparatus 100. The plurality of output data 'DQ<0:7>' generated by the data output section 120 are transmitted to the chipset, and the chipset is also inputted with the enabled decision signal 'flag', whereby the chipset can sense that the data having the levels opposite to those of the plurality of output data 'DQ<0:7>' are correct output data. That is, even though the data output section 120 outputs '1, 1, 1, 1, 1, 0, 0, 0' as the output data 'DQ<0:7>', the chipset can sense that the output data of '0, 0, 0, 0, 0, 1, 1, 1' should have been outputted as the correct output data.

In FIG. 5, after the mode signal 'mode' is disabled through the mode register set or by employing the test mode signal and the semiconductor memory apparatus 100 is set to operate in the second mode, if the semiconductor memory apparatus 100 is activated by being inputted with an active command 'ACT' and performs read operation in response to a read command 'Read', the data stored in the memory cells of a memory bank of the semiconductor memory apparatus 100 are loaded on the data input and output line GIO1. The plurality of data 'GIO<0:7>' loaded on the data input and output line GIO1 are inputted to the DBI decision unit 111 and the data repeater 112. The DBI decision unit 111 decides whether to enable or disable the decision signal 'flag', depending upon the logic levels of the plurality of data 'GIO<0:7>' inputted thereto.

In FIG. 5, since the majority of the plurality of data 'GIO<0:7>' has the low level, the DBI decision unit 111 enables the decision signal 'flag'. The data repeater 112 is inputted with the enabled decision signal 'flag', inverts the plurality of data 'GIO<0:7>', and outputs '1, 1, 1, 1, 1, 0, 0, 0' as the plurality of inversion data 'TGIO<0:7>'. Among the plurality of data 'GIO<0:7>', if the number of the data having the low level is greater than the number of the data having the high level, current consumption increases due to the toggling of data input and output lines GIO1 and GIO2. In this regard, in the first embodiment, similar to the first mode, when the data having the low level constitute a majority in the plurality of data 'GIO<0:7>' in the second mode, the plurality of data 'GIO<0:7>' are inverted and then inputted to the data output section 120, so that current consumption due to the toggling of the data input and output line GIO2, through which the plurality of inversion data 'TGIO<0:7>' are transmitted, can decrease.

Since the mode signal 'mode' is disabled in the second mode, the data output section 120 generates the plurality of output data 'DQ<0:7>' by inverting the plurality of inversion data 'TGIO<0:7>'. That is, the data output section 120 generates the output data 'DQ<0:7>' of '0, 0, 0, 0, 0, 1, 1, 1' by inverting the inversion data 'TGIO<0:7>' of '1, 1, 1, 1, 1, 0, 0, 0'. In the second mode, the decision signal 'flag' is not transmitted to the chipset. The plurality of output data 'DQ<0:7>' generated by the data output section 120 are transmitted to the chipset, and the chipset can sense that the levels of the plurality of output data 'DQ<0:7>' correspond to those of correct output data. That is, when the data output section 120 outputs '0, 0, 0, 0, 0, 1, 1, 1' as the output data 'DQ<0:7>', the chipset can sense '0, 0, 0, 0, 0, 1, 1, 1' as correct output data.

As described above, in the semiconductor memory apparatus 100 according to the first embodiment, differently from the conventional art, due to the fact that the data output section 120 is inputted with the mode signal 'mode' for selecting the first mode and the second mode, decides whether to invert the inversion data 'TGIO<0:7>' and generates the output data 'DQ<0:7>', data inversion is performed irrespective of the first mode and the second mode, whereby it is possible to completely overcome the difficulties caused when interfacing between the semiconductor memory apparatus 100 and the chipset.

Figure 6:
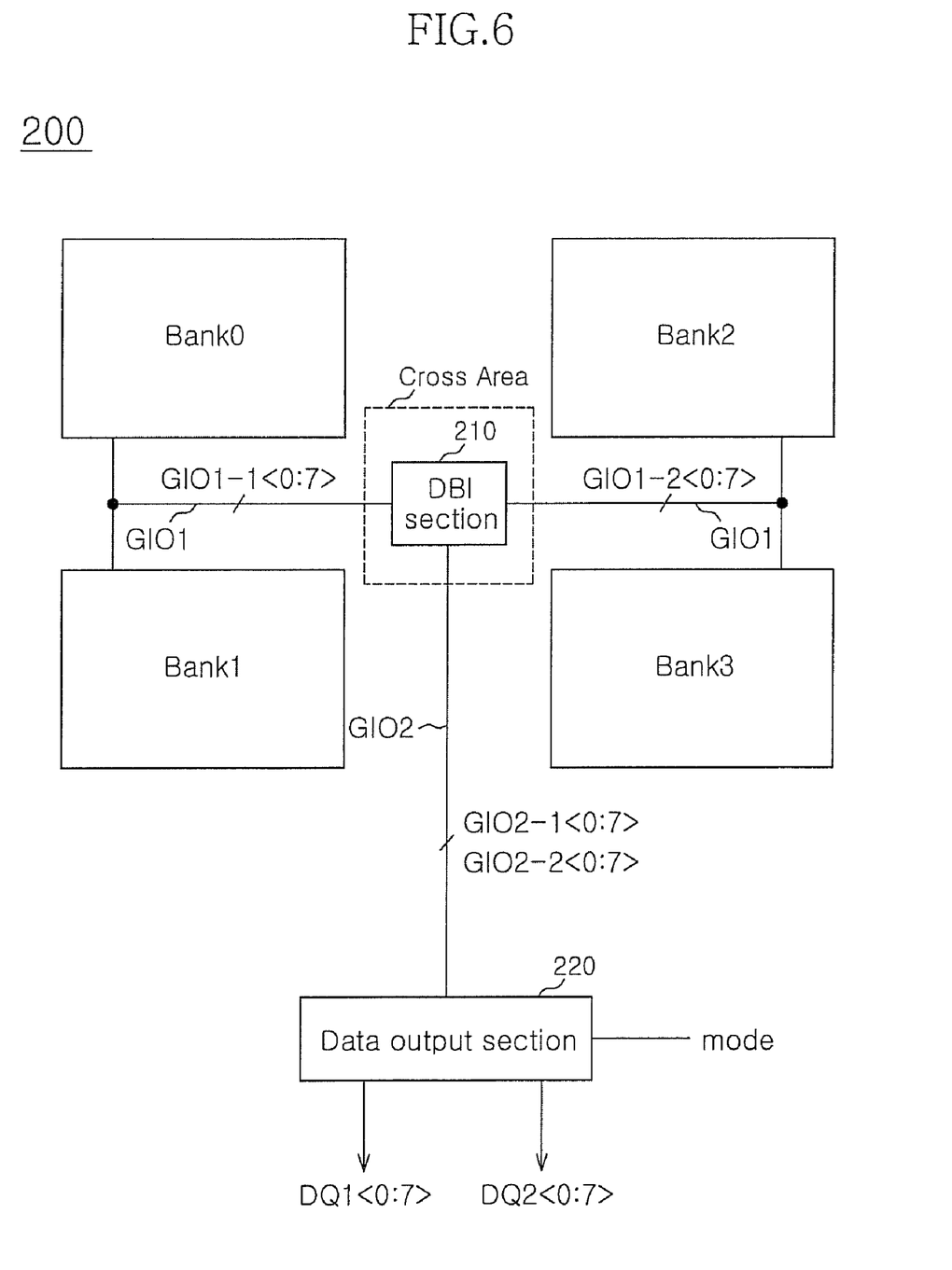
FIG. 6 is a schematic block diagram illustrating the configuration of an exemplary semiconductor memory apparatus in accordance with a second embodiment of the present invention.

FIG. 6 is a schematic block diagram illustrating the configuration of an exemplary semiconductor memory apparatus in accordance with a second embodiment. In FIG. 6, the semiconductor memory apparatus 200 according to this second embodiment can include a plurality of memory banks Bank0 through Bank3, a first data input and output line GIO1, a DBI section 210, a second data input and output line GIO2, and a data output section 220. The data input and output line GIO1 transmits a plurality of data 'GIO1-1<0:7>' and 'GIO1-

2<0:7>' which are applied from the plurality of memory banks Bank0 through Bank3. The DBI section 210 is positioned at a cross area 'Cross Area', is inputted with the plurality of data 'GIO1-1<0:7>' and 'GIO1-2<0:7>' transmitted from the first data input and output line GIO1, and decides whether to invert the plurality of data 'GIO1-1<0:7>' and 'GIO1-2<0:7>', depending upon the logic levels of the plurality of data 'GIO1-1<0:7>' and 'GIO1-2<0:7>'. In general, the cross area 'Cross Area' indicates an area where a row control circuit and a column control circuit cross with each other in a semiconductor memory apparatus. Since a number of data input and output lines are densely aggregated in the cross area Cross Area, power drop and current consumption can frequently occur therein.

The DBI section 210 inverts or outputs, without an inversion, the plurality of data 'GIO1-1<0:7>' and 'GIO1-2<0:7>' depending upon the logic levels of the plurality of data 'GIO1-1<0:7>' and 'GIO1-2<0:7>' and generates a plurality of inversion data 'GIO2-1<0:7>' and 'GIO2-2<0:7>'. The second data input and output line GIO2 transmits the plurality of inversion data 'GIO2-1<0:7>' and 'GIO2-2<0:7>'. The data output section 220 generates output data 'DQ1<0:7>' and 'DQ2<0:7>' depending upon the plurality of inversion data 'GIO2-1<0:7>' and 'GIO2-2<0:7>' transmitted from the second data input and output line GIO2. In the conventional art, a decision whether to invert data, is made immediately before the data 'GIO1-1<0:7>' and 'GIO1-2<0:7>' are inputted to the data output section 220, so that current consumption due to the toggling of the first and second data input and output lines GIO1 and GIO2 may occur. However, in the semiconductor memory apparatus 200 according to the second embodiment, the DBI section 210 positioned at the cross area 'Cross Area' is inputted with the data 'GIO1-1<0:7>' and 'GIO1-2<0:7>' which are applied from the respective memory banks Bank0 through Bank3, and then decides whether to invert the data 'GIO1-1<0:7>' and 'GIO1-2<0:7>'. That is, when the number of the data having a low level is greater than the number of the data having a high level, the DBI section 210 generates the inverted data as the inversion data 'GIO2-1<0:7>' and 'GIO2-2<0:7>', so that current consumption due to the toggling of the second input and output line GIO2 may decrease. When the number of the data having a high level is greater than the number of the data having a low level, the DBI section 210 generates the non-inverted data as the inversion data 'GIO2-1<0:7>' and 'GIO2-2<0:7>', so that current consumption due to the toggling of the second data input and output line GIO2 decreases. Also, in the semiconductor memory apparatus 200 according to the second embodiment, because the DBI section 210 is provided in the cross area 'Cross Area' being a dense region, the problems caused due to power drop and current consumption can be solved.

As is apparent from the above description, in the embodiment, difficulties in interfacing a semiconductor memory apparatus and a chipset can be solved so that data inversion can be performed not only in a DBI mode but also in a normal mode, unlike the conventional art in which data inversion is performed only in a DBI mode, whereby current consumption by data input and output lines can be substantially reduced.

Further, in the embodiment, whether to invert data is decided by receiving data, outputted from memory banks, at a cross area, whereby it is possible to reduce current consumption due to toggling of data input and output lines.

Although exemplary embodiments have been described for illustrative purposes, those skilled in the art will appreciate that various modifications, additions and substitutions are possible, without departing from the scope and the spirit as disclosed in the accompanying claims.

What is claimed is:

1. A semiconductor memory apparatus comprising:
   a data bus inversion (DBI) section configured to receive a plurality of input data to decide whether to invert or not invert the plurality of input data depending upon logic levels of the plurality of input data, and output the inverted data or non-inverted data based on the decision; and
   a data output section configured to receive the outputted data from the data bus inversion section, to invert or not invert the outputted data in response to a mode signal, and to generate a plurality of output data.

2. The semiconductor memory apparatus according to claim 1, wherein the DBI section is configured to invert the plurality of input data and output the inverted data when a majority of the plurality of input data has a first logic level, and to not invert the plurality of input data and output the non-inverted data when a majority of the plurality of input data has a second logic level.

3. The semiconductor memory apparatus according to claim 1, wherein the DBI section comprises:
   a DBI decision unit configured to generate a decision signal for deciding whether to invert or not invert the plurality of input data; and
   a data repeater configured to invert or not invert the plurality of input data in response to the decision signal.

4. The semiconductor memory apparatus according to claim 3, wherein the DBI decision unit is configured to enable the decision signal when the majority of the plurality of input data has a first logic level, and disable the decision signal when the majority of the plurality of input data has a second logic level.

5. The semiconductor memory apparatus according to claim 4, wherein the data repeater is configured to invert the plurality of input data and output the inverted data when the decision signal is enabled, and to not invert the plurality of input data and output the non-inverted data when the decision signal is disabled.

6. The semiconductor memory apparatus according to claim 3, further comprising:
   a transmission section configured to transmit the decision signal to a chipset coupled to the semiconductor memory apparatus, in response to the mode signal.

7. The semiconductor memory apparatus according to claim 6, wherein the DBI section is configured to transmit the decision signal to the chipset coupled to the semiconductor memory apparatus when the mode signal is enabled, and further configured to not transmit the decision signal to the chipset coupled to the semiconductor memory apparatus when the mode signal is disabled.

8. The semiconductor memory apparatus according to claim 1, wherein the data output section is configured to not invert the outputted data from the data bus inversion section and generate the plurality of output data when the mode signal is enabled, and to invert the outputted data from the data bus inversion section and generate the plurality of output data when the mode signal is disabled.

9. The semiconductor memory apparatus according to claim 1, wherein the mode signal includes a signal generated by a mode register set.

10. The semiconductor memory apparatus according to claim 1, wherein the mode signal includes a test mode signal.

11. A semiconductor memory apparatus comprising:
a plurality of memory banks;
a first data input and output line configured to transmit a plurality of data inputted from the plurality of memory banks;
a data bus inversion (DBI) section configured to decide whether to invert not invert the plurality of input data depending upon logic levels of the plurality of input data transmitted from the first data input and output line and to output the inverted data or non-inverted data based on the decision;
a second data input and output line configured to transmit the outputted data from the data bus inversion section; and
a data output section configured to receive the transmitted data from the second data input and output line to generate a plurality of output data in response to a mode signal.

12. The semiconductor memory apparatus according to claim 11, wherein the DBI section is configured to invert the plurality of input data and output the inverted data when a majority of the plurality of input data has a first logic level, and to not invert the plurality of input data and output the non-inverted data when a majority of the plurality of input data has a second logic level.

13. The semiconductor memory apparatus according to claim 11, wherein the DBI section comprises:
a DBI decision unit configured to generate a decision signal for deciding whether to invert or not invert the plurality of input data; and
a data repeater configured to invert or not invert the plurality of input data in response to the decision signal.

14. The semiconductor memory apparatus according to claim 13, wherein the DBI decision unit is configured to enable the decision signal when the majority of the plurality of input data has a first logic level, and to disable the decision signal when the majority of the plurality of input data has a second logic level.

15. The semiconductor memory apparatus according to claim 14, wherein the data repeater is configured to invert the plurality of input data and output the inverted data when the decision signal is enabled, and to not invert the plurality of input data and output the non-inverted data when the decision signal is disabled.

16. The semiconductor memory apparatus according to claim 13, further comprising:
a transmission section configured to transmit the decision signal to a chipset coupled to the semiconductor memory apparatus, in response to the mode signal.

17. The semiconductor memory apparatus according to claim 16, wherein the DBI section is configured to transmit the decision signal to the chipset coupled to the semiconductor memory apparatus when the mode signal is enabled, and to not transmit the decision signal to the chipset coupled to the semiconductor memory apparatus when the mode signal is disabled.

18. The semiconductor memory apparatus according to claim 11, wherein the data output section is configured to not invert the transmitted data from the second data input and output line to generate the plurality of output data when a mode signal is enabled, and to invert the transmitted data from the second data input and output line to generate the plurality of output data when the mode signal is disabled.

19. The semiconductor memory apparatus according to claim 11, wherein the mode signal includes a signal generated by a mode register set.

20. The semiconductor memory apparatus according to claim 11, wherein the mode signal includes a test mode signal.

21. The semiconductor memory apparatus according to claim 11, wherein the DBI section is located at a cross area.

22. A method for reading data in a semiconductor memory apparatus having a plurality of memory banks and operating in first and second modes, the method comprising:
deciding whether to invert or not invert a plurality of input data outputted from the plurality of memory banks depending upon logic levels of the plurality of data;
inverting or not inverting the plurality of input data based on the decision;
transmitting the inverted or non-inverted data through a data input and output line; and
receiving the inverted or non-inverted data and generating a plurality of output data depending upon whether the semiconductor memory apparatus operates in the first mode or the second mode.

23. The method according to claim 22, wherein deciding whether to invert or not invert the plurality of input data comprises:
generating a decision signal for deciding whether to invert or not invert the plurality of input data depending upon the logic levels of the plurality of data; and
inverting or not inverting the plurality of input data in response to the decision signal and outputting the inverted or non-inverted data based on the decision.

24. The method according to claim 23, wherein the decision signal is enabled when a majority of the plurality of input data has a first logic level and is disabled when a majority of the plurality of input data has a second logic level.

25. The method according to claim 23, wherein the decision signal is transmitted to a chipset coupled to the semiconductor memory apparatus, in the first mode, and is not transmitted to the chipset in the second mode.

26. The method according to claim 22, wherein receiving the inverted or non-inverted data comprises:
inverting the inverted or non-inverted data to generate the plurality of output data when the semiconductor memory apparatus operates in the first mode; and
outputting, without an inversion, the inverted or non-inverted data to generate the plurality of output data when the semiconductor memory apparatus operates in the second mode.

* * * * *